(12) United States Patent
Yoo

(10) Patent No.: US 8,751,181 B2
(45) Date of Patent: Jun. 10, 2014

(54) SEMICONDUCTOR DEVICE HAVING TEST FUNCTION AND TEST METHOD USING THE SAME

(75) Inventor: Byoung Sung Yoo, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 281 days.

(21) Appl. No.: 13/195,513

(22) Filed: Aug. 1, 2011

(65) Prior Publication Data

US 2012/0035877 A1 Feb. 9, 2012

(30) Foreign Application Priority Data

Aug. 4, 2010 (KR) .......................... 10-2010-0075252
Jul. 22, 2011 (KR) .......................... 10-2011-0072972

(51) Int. Cl.
*G01R 31/26* (2014.01)
*G01R 31/3187* (2006.01)

(52) U.S. Cl.
CPC .................................. *G01R 31/3187* (2013.01)
USPC ........................................................ 702/117

(58) Field of Classification Search
CPC ................................................... G01R 31/3187
USPC .......................................................... 702/117
See application file for complete search history.

(56) References Cited

U.S. PATENT DOCUMENTS

| 6,262,926 B1 * | 7/2001 | Nakai ............................ 365/200 |
| 6,621,357 B2 * | 9/2003 | Busch-Sorensen ......... 331/36 C |
| 2002/0015341 A1 * | 2/2002 | Urakawa ....................... 365/200 |

* cited by examiner

*Primary Examiner* — Bryan Bui
(74) *Attorney, Agent, or Firm* — William Park & Associates Patent Ltd.

(57) ABSTRACT

A semiconductor device having a test function includes a program counter for storing a breaking address in a storage unit in response to control signals, increasing a count address in response to the control signals, and storing the increased count address in the storage unit; a controller for stopping the increase of the count address when the count address is identical to the breaking address and outputting a pump holding signal; an oscillator for generating a clock signal in response to an enable signal and maintaining a current cycle of the clock signal in response to the pump holding signal; and a pump unit for generating an output voltage in response to the clock signal.

11 Claims, 4 Drawing Sheets

SEMICONDUCTOR DEVICE HAVING TEST FUNCTION AND TEST METHOD USING THE SAME

CROSS-REFERENCE TO RELATED APPLICATION

Priority are claimed to Korean patent application number 10-2010-0075252 filed on Aug. 4, 2010 and Korean patent application number 10-2011-0072972 filed on Jul. 22, 2011, the entire disclosure of which is incorporated by reference herein.

BACKGROUND

Exemplary embodiments relate to a semiconductor device having a test function and a test method using the same and, more particularly, to a semiconductor device having a test function capable of measuring an output voltage on operation timing desired by a user and a test method using the same.

A semiconductor manufacturing process includes several unit processes. Whether a product is completed is determined according to the result of each of the unit processes. The unit process has a standard suitable for the unit process, and whether the unit process is successful is determined in accordance with the standard. The unit processes include a test process for testing the electrical properties of a product. In order to determine whether a product can operate its functions normally, a test process is performed with automatically generated test conditions suitable for testing the functions using an automatic test apparatus.

A semiconductor device repeatedly performs a plurality of operations including a program operation, a read operation, and an erase operation. To repeatedly perform the operations, voltages suitable for the operating characteristics must be generated. Accordingly, the electrical characteristics of the semiconductor device are tested by checking whether the voltages optimized for the operations are generated.

FIG. 1 is a block diagram of a known semiconductor device.

Referring to FIG. 1, the pump circuit 11 of the semiconductor device generates high voltages, such as a program voltage Vpgm and an erase voltage Vera, in response to a clock signal CLK. The program voltage Vpgm or the erase voltage Vera is transmitted to the internal circuits via a high voltage switch 12. In a test operation, the generated high voltages are measured using an external device through an external pad 13.

In a conventional voltage measurement method of a semiconductor device, the measured voltages are the voltages generated after the semiconductor device is operated like an actual operation. The generated voltages are changed over time according to the characteristics of the semiconductor device having the operations varied over time. In order to measure the voltages in a desired section, all voltages measured from the section must be analyzed after the entire operation including the section is performed. In this method, it is difficult to precisely analyze a portion having a problem.

BRIEF SUMMARY

According to exemplary embodiments, an address for a section during which generated voltages will be tested by a user is stored in the control circuit of a semiconductor device. If an address counted by the control circuit is identical to the address stored in the control circuit when the semiconductor device is operated, the operation of a pump circuit is held, and generated voltages are measured. Accordingly, voltages generated during a desired section can be measured irrespective of a change of the time.

A semiconductor device having a test function according to an aspect of the present disclosure includes a program counter for storing a breaking address in a storage unit in response to control signals, increasing a count address in response to the control signals, and storing the increased count address in the storage unit; a controller for stopping the increase of the count address when the count address is identical to the breaking address and outputting a pump holding signal; an oscillator for generating a clock signal in response to an enable signal and blocking outputting of the clock signal in response to the pump holding signal; and a pump unit for generating an output voltage in response to the clock signal.

A test method of a semiconductor device according to another aspect of the present disclosure includes providing the semiconductor device including a control circuit and a pump circuit; storing a breaking address for a measurement section in the control circuit; generating an output voltage by activating the pump circuit; generating a count address by sequentially increasing a program address through a count operation; comparing the breaking address and the count address and if, as a result of the comparison, the breaking address is identical to the count address, holding the count operation; controlling the pump circuit so that the pump circuit uniformly generates the output voltage; and measuring the output voltage.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
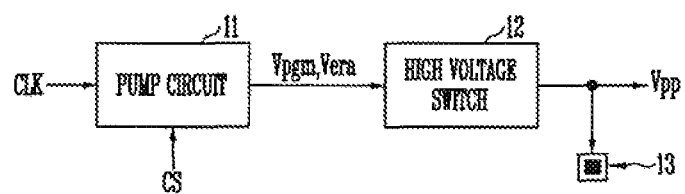
FIG. 1 is a block diagram of a known semiconductor device.
Figure 2:
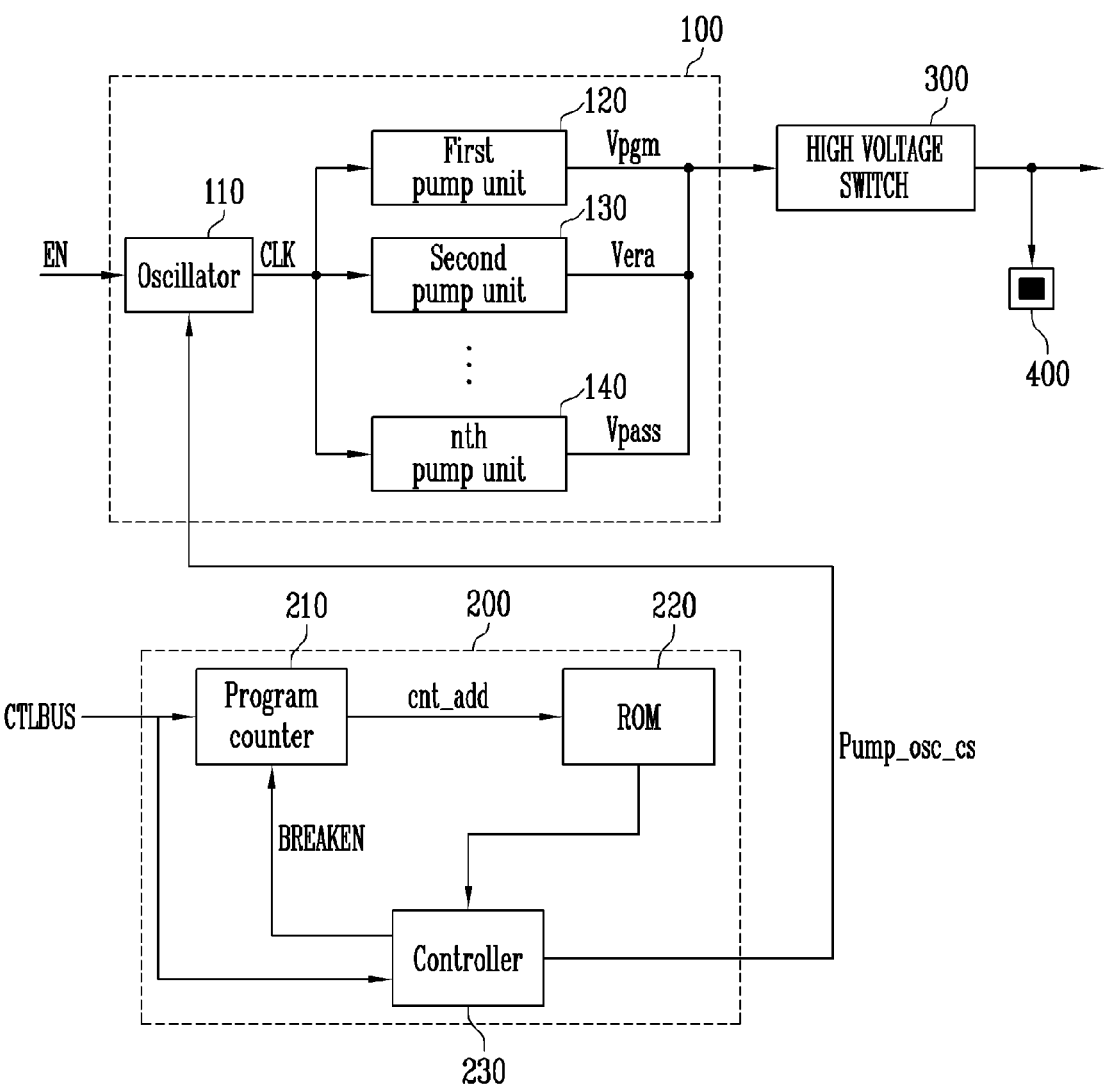
FIG. 2 is a block diagram of a semiconductor device according to an exemplary embodiment of this disclosure.

FIG. 2 is a block diagram of a semiconductor device according to an exemplary embodiment of this disclosure.

Referring to FIG. 2, the semiconductor device includes a pump circuit 100, a control circuit 200, a high voltage switch 300, and an external pad 400.

The pump circuit 100 generates a uniform voltage by uniformly maintaining the logic level of a clock signal CLK in response to a pump holding signal Pump_osc_cs generated by the control circuit 200. The pump circuit 100 includes an oscillator 110 and first, second to $n^{th}$ pump units 120, 130 to 140. The oscillator 110 is enabled in response to an enable signal EN and configured to generate the clock signal CLK. The oscillator 110 is blocking an output of the clock signal CLK in response to the pump holding signal Pump_osc_cs. That is, the oscillator 110 generates the clock signal CLK maintained a high level in response to the pump holding signal Pump_osc_cs. The first to $n^{th}$ pump units 120, 130 to 140 generate voltages including a program voltage Vpgm, an erase voltage Vera, to a pass voltage Vpass by performing respective pump operations in response to the clock signal CLK. The oscillator 110 generates the clock signal CLK maintained a high level in response to the pump holding signal Pump_osc_cs. When the level of the clock signal CLK becomes a maintained high level, the voltages generated by the first to $n^{th}$ pump units 120, 130 to 140 drop. If the logic level of the clock signal CLK is uniformly held, the first to $n^{th}$ pump units 120, 130 to 140 can generate output voltages having a uniform voltage level.

The control circuit 200 generates a count address cnt_add by counting a program address in response to control signals CTLBUS, compares the generated count address cnt_add and a breaking address inputted by a user, holds the count operation according to the result of the comparison, and generates the pump holding signal Pump_osc_cs for holding the operation of the pump circuit 100.

The control circuit 200 comprises a program counter 210, a storage unit such as, but not limited to, a ROM 220, and a controller 230.

The program counter 210 generates the count address cnt_add by counting a program address in response to the control signals CTLBUS. The count operation of the program counter 210 is stopped in response to a breaking enable signal BREAKEN. The program counter 210 counts the program address over time.

The ROM 220 stores the breaking address inputted by a user and generates breaking addresses bk_add by comparing the breaking address of the user and the count address cnt_add of the program counter 210. The breaking address inputted by a user is an address for a section for which voltages will be measured in a test operation.

The controller 230 generates the breaking enable signal BREAKEN for holding the count operation of the program counter 210 and the pump holding signal Pump_osc_cs for holding the pump operation of the pump circuit 100 in response to the breaking addresses bk_add.

The high voltage switch 300 switches the voltages including the program voltage Vpgm, the erase voltage Vera, or the pass voltage Vpass generated by the pump circuit 100 and outputs them to internal circuits.

The external pad 400 is coupled to an external voltage measurement device and configured to output the voltages including the program voltage Vpgm, the erase voltage Vera, or the pass voltage Vpass, switched by the high voltage switch 300, to the external measurement device so that the voltages can be measured.

Figure 3:
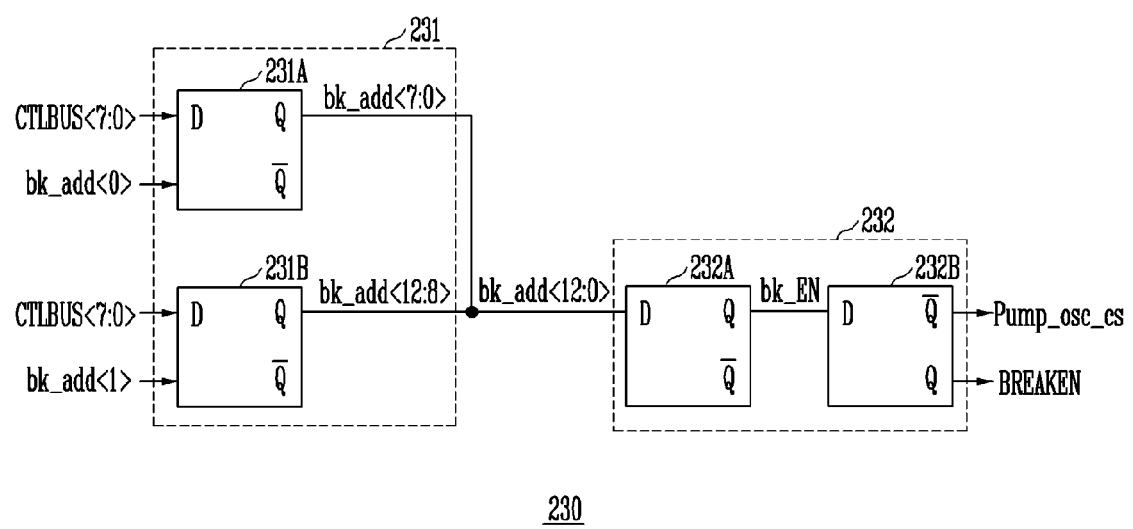
FIG. 3 is a detailed circuit diagram of a controller shown in FIG. 2.

FIG. 3 is a detailed circuit diagram of the controller 230 shown in FIG. 2.

Referring to FIG. 3, the controller 230 includes a breaking address combination unit 231 and a control signal generator 232.

The breaking address combination unit 231 generates internal breaking addresses bk_add<12:0> in response to the control signals CTLBUS<7:0> and the breaking addresses bk_add<1:0> of the ROM 220.

The breaking address combination unit 231 includes a first flip-flop 231A and a second flip-flop 231B. The first flip-flop 231A generates first internal breaking addresses bk_add<7:0> in response to the control signals CTLBUS<7:0> and the breaking address bk_add<0>. The second flip-flop 231B generates second internal breaking addresses bk_add<12:8> in response to the control signals CTLBUS<7:0> and the breaking address bk_add<1>. The first internal breaking addresses bk_add<7:0> and the second internal breaking addresses bk_add<12:8> are combined and outputted as the internal breaking addresses bk_add <12:0>.

The control signal generator 232 generates the breaking enable signal BREAKEN for holding the count operation of the program counter 210 and the pump holding signal Pump_osc_cs for uniformly maintaining the voltages of the pump circuit 100, in response to the internal breaking addresses bk_add <12:0>.

The control signal generator 232 includes a third flip-flop 232A and a fourth flip-flop 232B. The third flip-flop 232A generates a breaking signal bk_EN in response to the internal breaking addresses bk_add<12:0>. The fourth flip-flop 232B generates the breaking enable signal BREAKEN for holding the count operation of the program counter 210 and the pump holding signal Pump_osc_cs for uniformly maintaining the voltages of the pump circuit 100, in response to the breaking signal bk_EN.

Figure 4:
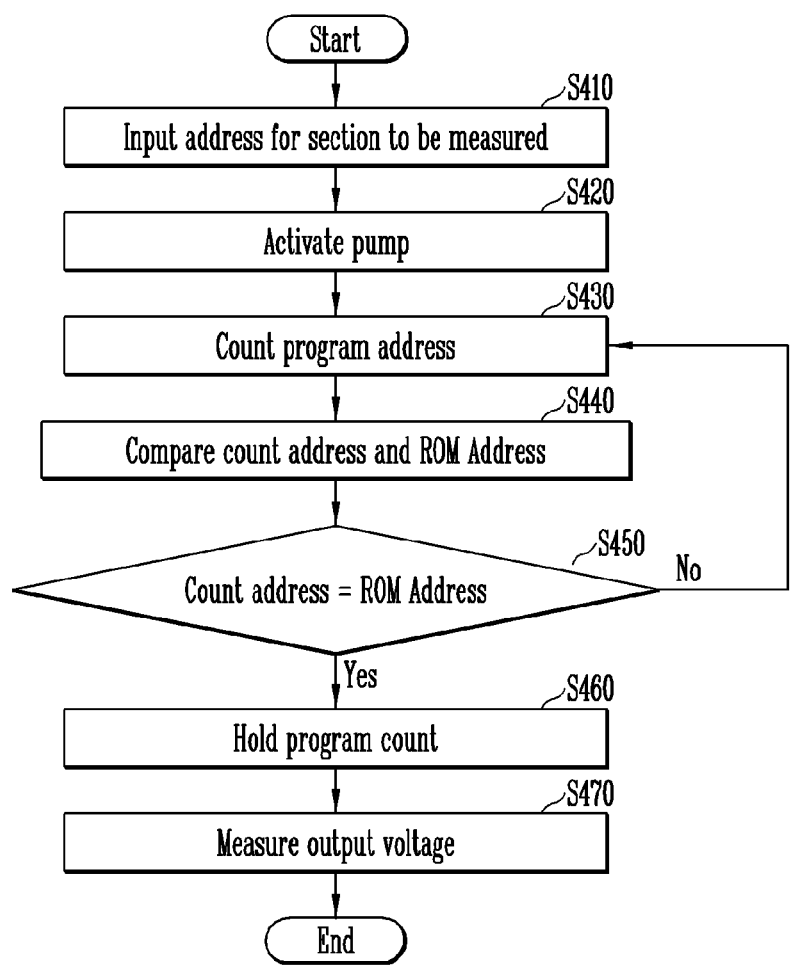
FIG. 4 is a flowchart illustrating a test method using the semiconductor device according to an exemplary embodiment of this disclosure.

FIG. 4 is a flowchart illustrating a test method of a semiconductor device according to an exemplary embodiment of this disclosure.

The voltage measurement method of the semiconductor device according to an exemplary embodiment of this disclosure is described below with reference to FIGS. 2 to 4.

1) Input the Address a Section that is to be Measured (S410)

A breaking address for a section to be measured in a test operation is inputted and stored in the ROM 220.

2) Enable Pump (S420)

The pump circuit 100 is activated in response to the pump holding signal Pump_osc_cs received from the controller 230. The pump circuit 100 generates one or more voltages including the program voltage Vpgm, the erase voltage Vera, or the pass voltage Vpass by performing a pump operation. The oscillator 110 of the pump circuit 100 raises or drops the voltages generated by the first to $n^{th}$ pump units 120, 130 to 140 by holding the logic level of the clock signal CLK to a high level in response to the pump holding signal Pump_osc_cs, so that the appropriate voltages, for example, the voltages that are varied over time, can be generated. This is because the voltages used are not uniform but raised or dropped over time when the device is operated.

3) Count the Program Address (S430)

The program counter 210 of the control circuit 200 performs a count operation for sequentially increasing a program address in response to the control signals CTRBUS and generates the count address cnt_add.

4) Compare the Count Address and the Breaking Address (S440)

The control circuit 200 compares the breaking address stored in the ROM 220 and the count address cnt_add received from the program counter 210.

5) Determination: Compare the Count Address and the Breaking Address (S450)

If, as a result of the comparison S440, the count address cnt_add is not identical to the breaking address, the program counter 210 continues to perform the count operation and generates the count address cnt_add having the program address increased.

If, as a result of the comparison, the count address cnt_add is identical to the breaking address, the controller 230 generates the breaking addresses bk_add.

6) Hold Program Count (S460)

When the count address cnt_add is identical to the breaking address, the controller 230 generates the breaking enable signal BREAKEN for holding the count operation of the program counter 210 and the pump holding signal Pump_osc_cs for holding the logic level of the clock signal CLK outputted from the oscillator 110 to a high level in response to the breaking addresses bk_add of the controller 230. Accordingly, the count operation of the program counter 210 is held, and the logic level of the clock signal CLK outputted from the oscillator 110 of the pump circuit 100 holds uniform.

7) Measure the Output Voltages (S470)

The count address cnt add is not increased because the count operation of the program counter 210 is held. Since the ROM 220 continues to generate the same breaking address bk_add, the controller 230 performs control so that the count operation of the program counter 210 is held and the logic level of the clock signal CLK of the oscillator 110 holdings uniform.

The first to $n^{th}$ pump units 120, 130 to 140 of the pump circuit 100 generate the respective voltages having uniform levels in response to the clock signal CLK. The voltages including the program voltage Vpgm, the erase voltage Vera, or the pass voltage Vpass are outputted to the external measurement device via the high voltage switch 300 for measurement via the external pad 400.

As described above, according to an embodiment of the present disclosure, an address for a section during which generated voltages will be tested by a user is stored in the control circuit of the semiconductor device. If an address counted by the control circuit is identical to the address stored in the control circuit when the semiconductor device is operated, voltages outputted from the control circuit are uniformly maintained and then measured. Accordingly, the voltages generated during a desired section can be precisely measured and analyzed irrespective of a change in time.

What is claimed is:

1. A semiconductor device having a test function, comprising:
   a program counter configured to store a count address in a storage unit in response to control signals, and to increase a count address in response to the control signals and store the increased count address in the storage unit;
   a controller configured to stop the increase of the count address when the count address equals the breaking address and output a pump holding signal;
   an oscillator configured to generate a clock signal in response to an enable signal and maintain a current cycle of the clock signal in response to the pump holding signal; and
   a pump unit configured to generate an output voltage in response to the clock signal.

2. The semiconductor device of claim 1, wherein the controller comprises:
   a breaking address combination unit configured to generate internal breaking addresses in response to a breaking signal; and
   a control signal generator configured to generate the breaking enable signal and the pump holding signal in response to the internal breaking addresses.

3. The semiconductor device of claim 1, further comprising:
   a high voltage switch configured to switch the output voltage; and
   an external pad configured to make available the output voltage.

4. The semiconductor device of claim 1, wherein the storage unit is configured to generate a breaking signal by comparing the breaking address and the count address.

5. The semiconductor device of claim 4, wherein the
   controller configured to generate a breaking enable signal to hold a count operation of the program counter and the pump holding signal to enable the pump circuit to maintain the current output voltage, in response to the breaking signal.

6. The semiconductor device of claim 4, wherein the pump unit comprises
   pumps for generating the output voltage in response to the clock signal, wherein the output voltage is controlled according to the cycle of the clock signal.

7. The semiconductor device of claim 1, wherein the pump unit maintains the current output voltage when the count address equals the breaking address.

8. The semiconductor device of claim 1, wherein the controller holds a pump operation of the pump unit when the count address equals the breaking address.

9. A test method of a semiconductor device, comprising:
   receiving a breaking address for a measurement section for testing;
   generating an output voltage by activating a pump circuit;
   generating a count address by sequentially increasing a program address through a counting operation;
   comparing the breaking address and the count address and stopping the counting operation when the breaking address equals the count address; and
   controlling the pump circuit so that the pump circuit uniformly generates the output voltage.

10. The test method of claim 9, wherein the count address is generated by counting a program address.

11. The test method of claim 9, further comprising performing the count operation when the breaking address does not equal the count address.

* * * * *